(12) United States Patent
Yamasaki

(10) Patent No.: US 10,156,717 B2
(45) Date of Patent: Dec. 18, 2018

(54) ELECTRO-OPTICAL DEVICE, METHOD OF MANUFACTURING ELECTRO-OPTICAL DEVICE, ELECTRO-OPTICAL UNIT, AND ELECTRONIC APPARATUS

(71) Applicant: SEIKO EPSON CORPORATION, Tokyo (JP)

(72) Inventor: Yasuo Yamasaki, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 6 days.

(21) Appl. No.: 15/348,172

(22) Filed: Nov. 10, 2016

(65) Prior Publication Data
US 2017/0059853 A1    Mar. 2, 2017

Related U.S. Application Data

(63) Continuation of application No. 15/017,960, filed on Feb. 8, 2016, now Pat. No. 9,547,169.

(30) Foreign Application Priority Data

Mar. 27, 2015  (JP) ................................. 2015-065934

(51) Int. Cl.
*G02B 26/08* (2006.01)
*G02B 7/00* (2006.01)

(52) U.S. Cl.
CPC .......... *G02B 26/0841* (2013.01); *G02B 7/00* (2013.01); *G02B 7/008* (2013.01); *G02B 26/08* (2013.01); *G02B 26/085* (2013.01); *G02B 26/0816* (2013.01); *G02B 26/0833* (2013.01); *H01L 2224/32225* (2013.01); *H01L 2224/48091* (2013.01); *H01L 2224/48227* (2013.01); *H01L 2224/73265* (2013.01); *H01L 2224/8592* (2013.01); *H01L 2924/15174* (2013.01)

(58) Field of Classification Search
CPC  G02B 26/0841; G02B 26/08; G02B 26/0816; G02B 26/0833; G02B 26/085; G02B 7/00; G02B 7/008
USPC ........................................................ 359/845
See application file for complete search history.

(56) References Cited

U.S. PATENT DOCUMENTS

| 4,481,531 | A | 11/1984 | Warde et al. |
| 5,042,923 | A | 8/1991 | Wolf et al. |
| 6,457,830 | B1 | 10/2002 | Choi |
| 6,555,904 | B1 * | 4/2003 | Karpman .............. B81B 7/0064 257/433 |
| 6,700,557 | B1 | 3/2004 | McKnight |

(Continued)

FOREIGN PATENT DOCUMENTS

JP    2012-198401 A    10/2012

OTHER PUBLICATIONS

Apr. 27, 2016 Office Action issued in U.S. Appl. No. 15/017,960.

*Primary Examiner* — William R Alexander
(74) *Attorney, Agent, or Firm* — Oliff PLC

(57) ABSTRACT

In an electro-optical device, light is incident on a mirror by penetrating a cover, and the light reflected by the mirror is emitted by penetrating the cover. Here, the cover includes a first light-transmitting plate and a second light-transmitting plate facing the first light-transmitting plate, and a gap which is open toward both sides in a first direction is provided between the first light-transmitting plate and the second light-transmitting plate due to a spacer.

8 Claims, 12 Drawing Sheets

(56) References Cited

U.S. PATENT DOCUMENTS

| | | | |
|---|---|---|---|
| 7,417,783 B2* | 8/2008 | Chui | G02B 26/0841 |
| | | | 359/223.1 |
| 7,518,775 B2* | 4/2009 | Miles | B81C 1/0023 |
| | | | 359/238 |
| 7,898,724 B2 | 3/2011 | Liu et al. | |
| 8,517,545 B2* | 8/2013 | Quenzer | B81B 7/0067 |
| | | | 359/514 |
| 2001/0021297 A1* | 9/2001 | Akira | G02B 6/4296 |
| | | | 385/116 |
| 2004/0257491 A1 | 12/2004 | Kitabayashi | |
| 2005/0078348 A1* | 4/2005 | Lin | B81C 1/00801 |
| | | | 359/291 |
| 2005/0184304 A1* | 8/2005 | Gupta | B81C 1/00214 |
| | | | 257/98 |
| 2007/0030436 A1 | 2/2007 | Sasabayashi | |
| 2008/0111203 A1* | 5/2008 | Pan | B81C 1/00285 |
| | | | 257/415 |
| 2009/0207474 A1 | 8/2009 | Ishii et al. | |
| 2013/0070249 A1 | 3/2013 | Choi | |
| 2013/0156371 A1 | 6/2013 | Maetani et al. | |
| 2013/0242275 A1* | 9/2013 | Kilcher | G02B 26/0833 |
| | | | 353/98 |
| 2014/0002964 A1* | 1/2014 | Li | G02B 26/001 |
| | | | 361/679.01 |
| 2016/0282607 A1* | 9/2016 | Yamasaki | G02B 26/085 |

\* cited by examiner

ELECTRO-OPTICAL DEVICE, METHOD OF MANUFACTURING ELECTRO-OPTICAL DEVICE, ELECTRO-OPTICAL UNIT, AND ELECTRONIC APPARATUS

This is a Continuation of U.S. application Ser. No. 15/017,960 filed Feb. 8, 2016, which claims the benefit of Japanese Application No. 2015-065934 filed Mar. 27, 2015. The disclosures of the prior applications are hereby incorporated by reference herein in their entireties.

BACKGROUND

1. Technical Field

The present invention relates to an electro-optical device provided with a mirror, a method of manufacturing the electro-optical device, an electro-optical unit, and an electronic apparatus.

2. Related Art

As an electronic apparatus, for example, a projection type display device or the like is known which displays an image on a screen by modulating light emitted from a light source by a plurality of mirrors (micromirrors) of an electro-optical device called a digital mirror device (DMD) and then enlarging and projecting the modulated light by a projection optical system. The electro-optical device which is used in such a projection type display device or the like is provided with an element substrate 1 in which a mirror 50 is provided on a one-side surface 1s, a frame section 61 bonded to the one-side surface 1s side of the element substrate 1 so as to surround the mirror 50 when viewed in a plan view, and a plate-shaped light-transmitting cover 71 supported on an end portion on the side opposite to the element substrate 1, of the frame section 61, as shown in FIG. 13, for example. Further, the electro-optical device has, for example, a support substrate 90 in which a concave substrate mounting portion 93 surrounded by a side wall 92 is formed, and the element substrate 1 is fixed to a bottom portion of the substrate mounting portion 93 by an adhesive 97 and then sealed by sealing resin 98 provided in the substrate mounting portion 93.

In the electro-optical device configured in this manner, light is incident on the mirror 50 by penetrating the light-transmitting cover 71, and the light reflected by the mirror 50 is emitted by penetrating the light-transmitting cover 71. At this time, the temperature of the element substrate 1 or the like rises due to the light illuminated to the light-transmitting cover 71 or the one-side surface 1s of the element substrate 1. Such a rise in temperature causes a malfunction or a decrease in life of the electro-optical device, and therefore, it is not preferable.

On the other hand, as a method of increasing the heat dissipation of a device mounted on the support substrate 90, a technique of widening the contact area between the device and the sealing resin is proposed (refer to U.S. Pat. No. 7,898,724 B2). For example, as shown in FIG. 13, a configuration is made in which the surface of the sealing resin 98 is in contact with the light-transmitting cover 71 at a position higher than a position where the surface of the sealing resin 98 is in contact with the side wall 92 of the support substrate 90. According to such a configuration, it is possible to increase heat transfer efficiency from the light-transmitting cover 71 to the sealing resin 98.

However, according to the configuration shown in FIG. 13, even if the heat transfer efficiency from the light-transmitting cover 71 to the sealing resin 98 is increased, since the heat transfer efficiency of the sealing resin 98 itself is low, there is a problem in that it is not possible to sufficiently suppress an rise in the temperature of the element substrate 1.

SUMMARY

An advantage of some aspects of the invention is to provide an electro-optical device in which it is possible to suppress a rise in the temperature of an element substrate or the like which is provided with a mirror, a method of manufacturing the electro-optical device, an electro-optical unit, and an electronic apparatus.

An electro-optical device according to an aspect of the invention includes: an element substrate on which a mirror and a drive element which drives the mirror are provided on a first surface side; and a cover which is provided on the first surface side and disposed such that the mirror is located between the element substrate and the cover, wherein the cover includes a first light-transmitting plate having a light-transmitting property, a second light-transmitting plate having a light-transmitting property and disposed such that the first light-transmitting plate is located between the mirror and the second light-transmitting plate, and a spacer which is interposed between the first light-transmitting plate and the second light-transmitting plate and provided with a gap which is open toward both sides in a first direction intersecting a thickness direction in which the first light-transmitting plate and the second light-transmitting plate face each other, between the first light-transmitting plate and the second light-transmitting plate.

In the electro-optical device according to the aspect of the invention, light is incident on the mirror by penetrating the cover, and the light reflected by the mirror is emitted by penetrating the cover. At this time, the temperature of the element substrate or the like tries to rise due to the light illuminated to the cover or a one-side surface of the element substrate. Here, in the cover, the gap which is open toward both sides in the first direction is provided between the first light-transmitting plate and the second light-transmitting plate due to the spacer. For this reason, by passing a fluid such as air through the gap, it is possible to increase heat dissipation of the cover or the like. Therefore, even when the temperature of the element substrate or the like tries to rise due to the illuminated light or the like, it is possible to suppress a rise in the temperature of the element substrate or the like. For this reason, it is possible to suppress a malfunction or a decrease in life of the electro-optical device.

In the aspect of the invention, it is preferable that the spacer is configured integrally with the second light-transmitting plate. According to such a configuration, it is possible to improve the efficiency of assembly work of the electro-optical device.

The aspect of the invention may adopt a configuration in which the spacer includes a first spacer which extends in the first direction, and a second spacer which extends in the first direction at a position separated from the first spacer in a second direction intersecting the thickness direction and the first direction with respect to the first spacer, and the gap is open toward both sides in the first direction between the first spacer and the second spacer. According to such a configuration, when a fluid such as air passes through the gap, leakage of the fluid in the second direction does not occur, and therefore, flow velocity in the gap is fast. Therefore, it is possible to increase heat dissipation in the cover.

In the aspect of the invention, it is preferable that the first spacer and the second spacer extend in the first direction along end portions which are located on both sides in the second direction in the first light-transmitting plate. According to such a configuration, when a fluid such as air passes through the gap, it is possible to widen the contact area between the first light-transmitting plate and the fluid. Therefore, it is possible to increase heat dissipation in the cover.

In the electro-optical device according to the aspect of the invention, it is preferable that the electro-optical device further includes a blower which supplies air toward the gap from one side in the first direction with respect to the gap. Further, in the aspect of the invention, an electro-optical unit in which the electro-optical device and the blower are supported on a holder may be configured. According to such a configuration, it is possible to reliably pass air through the gap between the first light-transmitting plate and the second light-transmitting plate, and therefore, it is possible to increase heat dissipation in the cover.

In this case, it is preferable that the electro-optical device further includes a support substrate on which the element substrate is mounted and that the support substrate is provided with a bottom plate portion on which the element substrate is mounted, a first side wall which protrudes from the bottom plate portion to a side on which the element substrate is mounted, on the one side in the first direction with respect to the element substrate, and a second side wall which protrudes from the bottom plate portion to the side on which the element substrate is mounted, on the other side in the first direction with respect to the element substrate, and the first side wall has a higher height from the bottom plate portion than the second side wall. According to such a configuration, an air flow having gotten over the first side wall wraps around to the inside of the first side wall and then easily flows toward the gap. Therefore, it is possible to increase heat dissipation in the cover.

An electro-optical device according to another aspect of the invention includes: an element substrate on which a mirror and a drive element which drives the mirror are provided on a first surface side; and a cover which is provided on the first surface side and disposed such that the mirror is located between the element substrate and the cover, wherein the cover includes a first light-transmitting plate having a light-transmitting property, a second light-transmitting plate having a light-transmitting property and disposed such that the first light-transmitting plate is located between the mirror and the second light-transmitting plate, and a spacer which is located between the first light-transmitting plate and the second light-transmitting plate, has a first spacer extending in a first direction, and a second spacer extending in the first direction at a position separated from the first spacer in a second direction intersecting the first direction with respect to the first spacer, and is provided to avoid at least a portion of a first end portion of the first light-transmitting plate in the first direction and avoid at least a portion of a second end portion facing the first end portion of the first light-transmitting plate in the first direction.

In the electro-optical device according to the aspect of the invention, light is incident on the mirror by penetrating the cover, and the light reflected by the mirror is emitted by penetrating the cover. At this time, the temperature of the element substrate or the like tries to rise due to the light illuminated to the cover or a one-side surface of the element substrate. Here, in the cover, the gap which is open toward both sides in the first direction is provided between the first light-transmitting plate and the second light-transmitting plate due to the spacer. For this reason, by passing a fluid such as air through the gap, it is possible to increase heat dissipation of the cover or the like. Therefore, even when the temperature of the element substrate or the like tries to rise due to the illuminated light or the like, it is possible to suppress a rise in the temperature of the element substrate or the like. For this reason, it is possible to suppress a malfunction or a decrease in life of the electro-optical device.

A method of manufacturing an electro-optical device according to still another aspect of the invention includes: preparing a first wafer on which a mirror and a drive element which drives the mirror are provided on a first surface side; forming a laminated wafer in which a second wafer having a light-transmitting property and a third wafer having a light-transmitting property are bonded to overlap each other through a spacer and a concave portion is formed in a second surface on a side opposite to a surface facing the third wafer, of the second wafer; bonding the first surface of the first wafer and the second surface of the second wafer to each other in an overlap state such that the mirror and the drive element overlap the concave portion when viewed in a plan view; and dividing a portion with the mirror and the drive element provided therein from the first wafer and the laminated wafer.

In the aspect of the invention, it is preferable that in the formation of the laminated wafer, after the spacer is formed integrally with, for example, the third wafer, a fourth wafer having a light-transmitting property, which configures a third surface side on a side opposite to the second surface of the second wafer, is bonded to overlap a side on which the spacer is formed, of the third wafer, and a fifth wafer having a light-transmitting property, which configures the first surface side of the second wafer, is bonded to overlap the fourth wafer, and a through-hole for configuring the concave portion is formed in the fifth wafer.

The electro-optical device or the electro-optical unit to which the invention is applied can be used in a variety of electronic apparatuses, and in this case, an electronic apparatus is provided with a light source unit which irradiates the mirror with light source light. Further, in a case where as an electronic apparatus, a projection type display device is configured, the electronic apparatus is further provided with a projection optical system which projects light modulated by the mirror.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
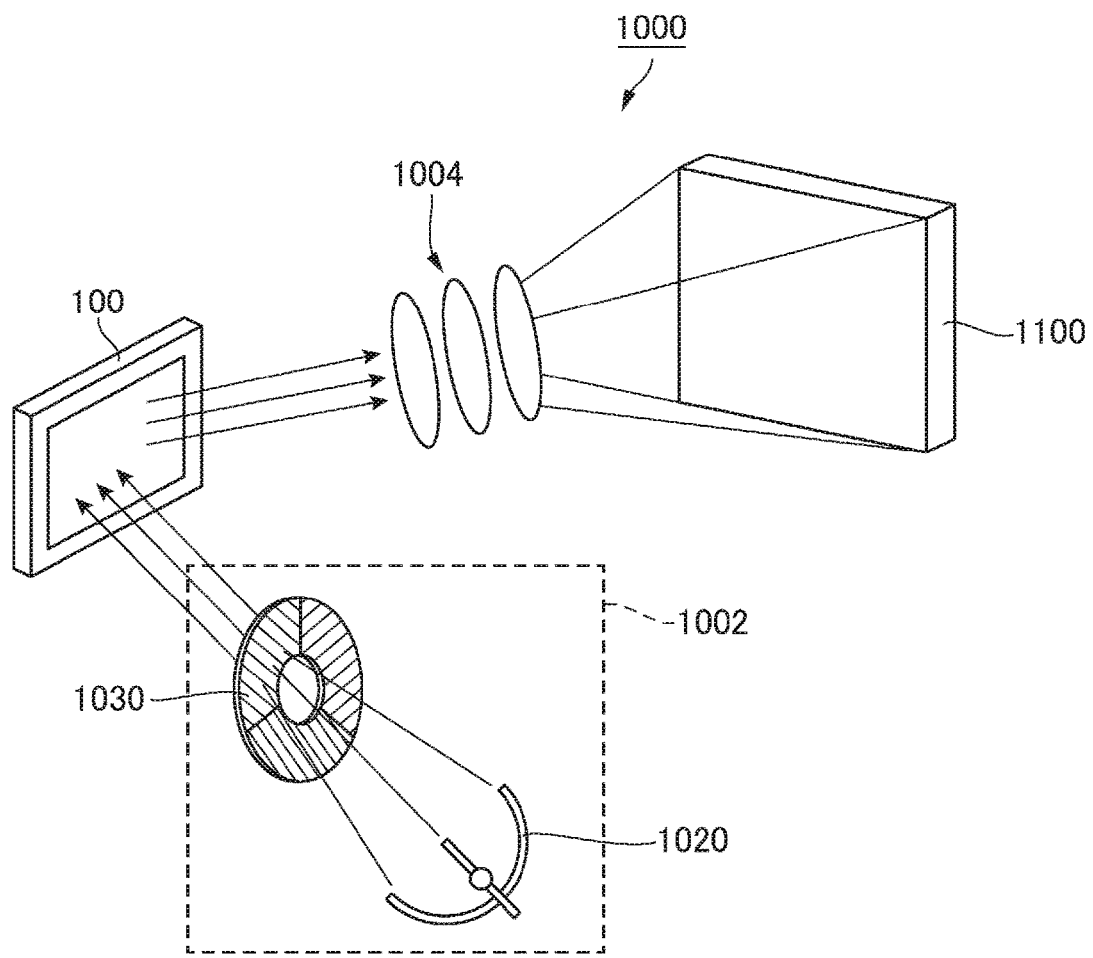
FIG. 1 is a schematic diagram showing an optical system of a projection type display device as an electronic apparatus to which the invention is applied.

Embodiments of the invention will be described with reference to the drawings. In addition, in the following description, as an electronic apparatus to which the invention is applied, a projection type display device will be described. Further, in the drawings which are referred to in the following description, in order to make each layer or each member have a size of the degree recognizable on the drawings, a reduced scale is varied for each layer or each member. The number of mirrors or the like shown in the drawings is set such that the mirror or the like has a size of the degree recognizable on the drawings. However, more mirrors or the like than the number shown in the drawings may be provided. In addition, in the following embodiments, it is assumed that a case of being described, for example, as "being disposed on the first surface side" may include a case of being disposed so as to be in contact with the first surface, a case of being disposed on the first surface through the other component, or a case of being partially disposed so as to be in contact with the first surface and being partially disposed through the other component.

Embodiment 1

Projection Type Display Device as Electronic Apparatus

FIG. 1 is a schematic diagram showing an optical system of a projection type display device as an electronic apparatus to which the invention is applied. A projection type display device 1000 shown in FIG. 1 has a light source unit 1002, an electro-optical device 100 which modulates light emitted from the light source unit 1002 in accordance with image information, and a projection optical system 1004 which projects the light modulated in the electro-optical device 100 to a projected object 1100 such as a screen as a projection image. The light source unit 1002 is provided with a light source 1020 and a color filter 1030. The light source 1020 emits white light, the color filter 1030 emits light of each color in accordance with rotation, and the electro-optical device 100 modulates incident light at a timing synchronized with the rotation of the color filter 1030. In addition, instead of the color filter 1030, a phosphor substrate which converts the light emitted from the light source 1020 into light of each color may be used. Further, the light source unit 1002 and the electro-optical device 100 may be provided for each light of each color.

Basic Configuration of Electro-Optical Device 100

Figure 2A:
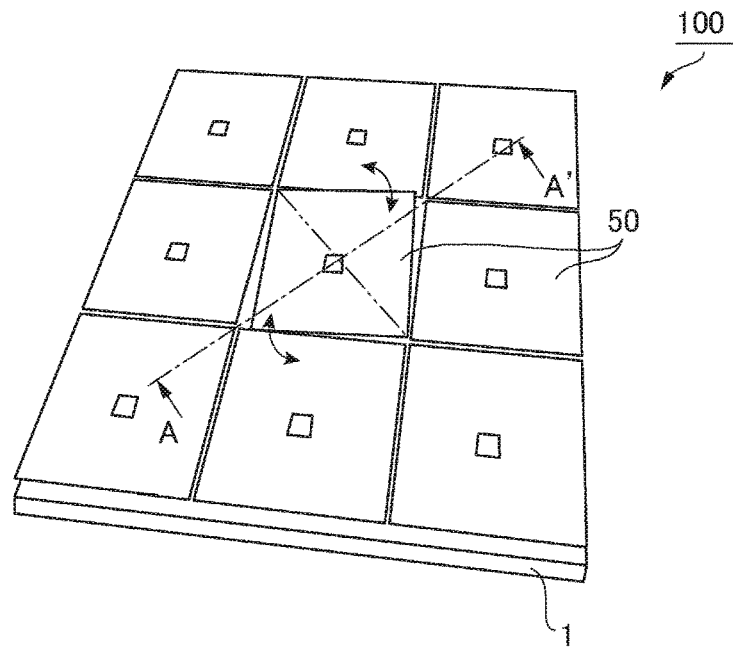
FIGS. 2A and 2B are explanatory diagrams schematically showing a basic configuration of an electro-optical device to which the invention is applied.
Figure 2B:
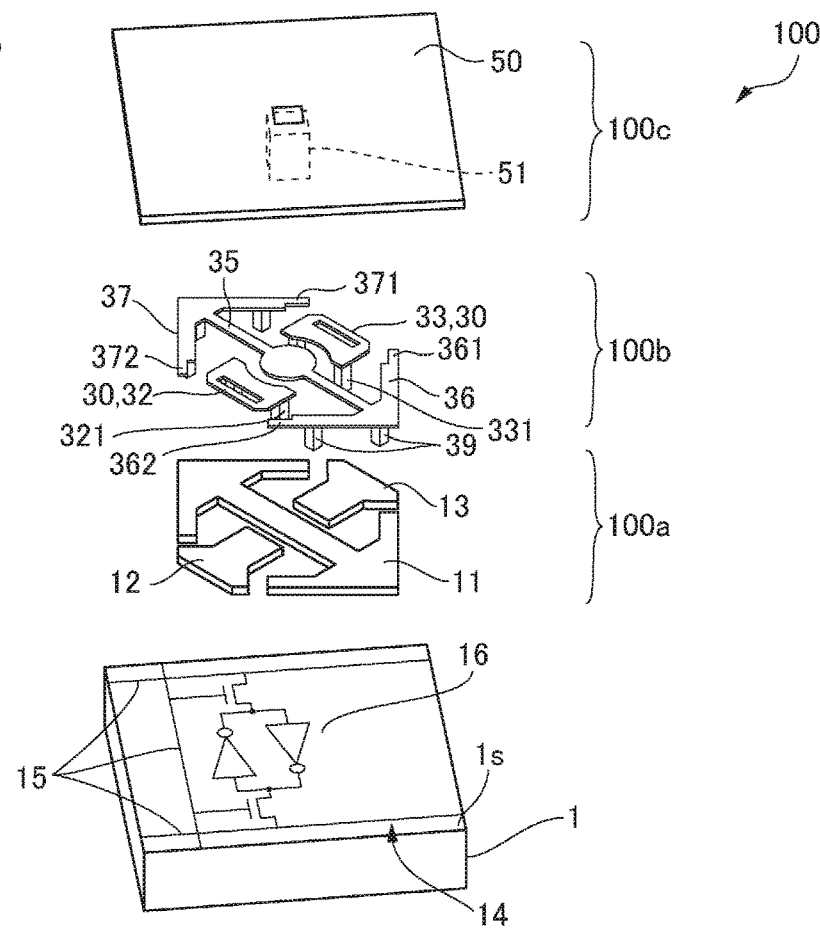
Figure 3A:
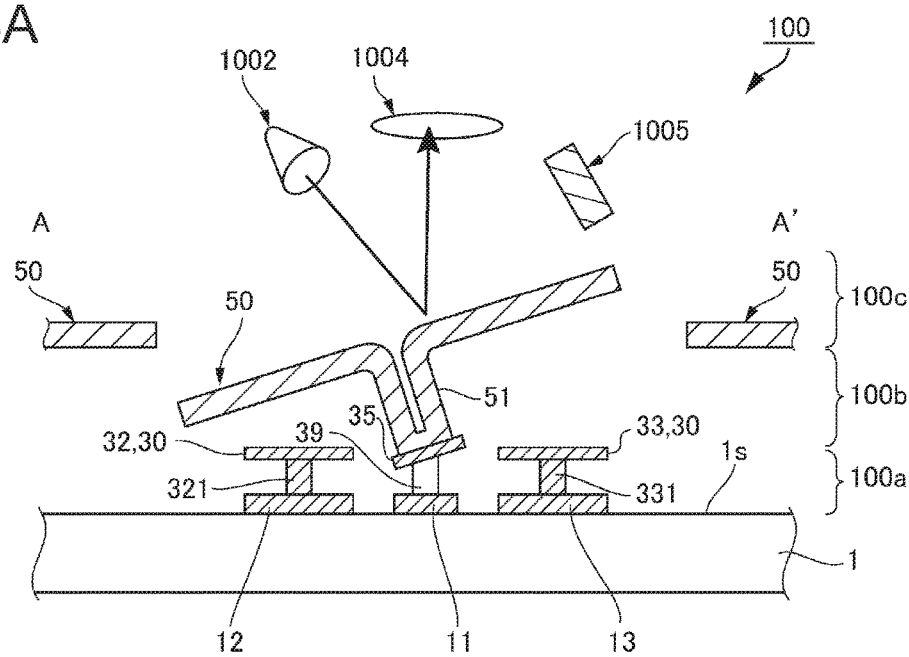
FIGS. 3A and 3B are explanatory diagrams schematically showing a basic configuration of the electro-optical device to which the invention is applied.
Figure 3B:
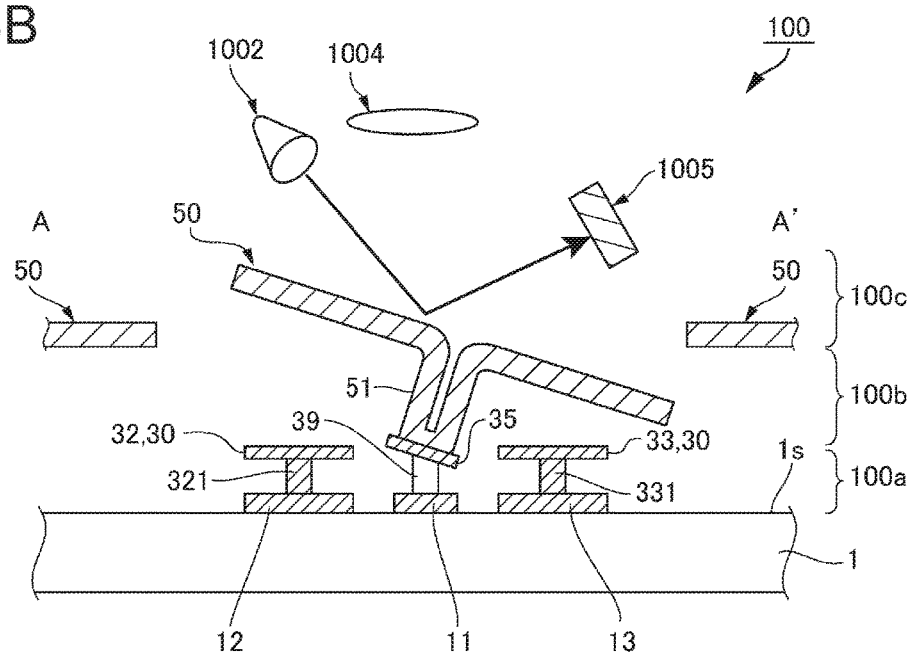

FIGS. 2A and 2B are explanatory diagrams schematically showing a basic configuration of the electro-optical device 100 to which the invention is applied, and FIGS. 2A and 2B respectively are an explanatory diagram showing a main section of the electro-optical device 100 and an exploded perspective view of the main section of the electro-optical device 100. FIGS. 3A and 3B are explanatory diagrams showing a line A-A' cross-section in the main section of the electro-optical device 100 to which the invention is applied, and FIGS. 3A and 3B respectively are an explanatory diagram schematically showing a state where a mirror is tilted to one side and an explanatory diagram schematically showing a state where the mirror is tilted to the other side.

As shown in FIGS. 2A to 3B, in the electro-optical device 100, a plurality of mirrors 50 are disposed on the one-side surface 1s (first surface) side of an element substrate 1 in a matrix form, and the mirrors 50 are separated from the element substrate 1. The element substrate 1 is, for example, a silicon substrate. Each of the mirrors 50 is, for example, a micromirror having a plane size in which the length of one side is in a range of 10 μm to 30 μm, for example. The mirrors 50 are disposed with an array in a range of 800×600 to 1028×1024, for example, and one mirror 50 corresponds to one pixel of an image.

The surface of the mirror 50 is a reflective surface made of a reflective metal film such as aluminum, for example. The electro-optical device 100 is provided with a first floor portion 100a which includes a substrate-side bias electrode 11, substrate-side address electrodes 12 and 13, and the like formed on the one-side surface 1s of the element substrate 1, a second floor portion 100b which includes elevated address electrodes 32 and 33 and a hinge 35, and a third floor portion 100c which includes the mirrors 50. In the first floor portion 100a, an addressing circuit 14 is formed on the element substrate 1. The addressing circuit 14 is provided with a memory cell for selectively controlling an operation of each mirror 50, wiring 15 of a word line and a bit line, and the like, and has a circuit configuration similar to a random access memory (RAM) provided with a CMOS circuit 16.

The second floor portion 100b includes the elevated address electrodes 32 and 33, the hinge 35, and a mirror post 51. The elevated address electrodes 32 and 33 electrically conduct to the substrate-side address electrodes 12 and 13 through electrode posts 321 and 331 and are supported by the substrate-side address electrodes 12 and 13. Hinge arms 36 and 37 extend from both ends of the hinge 35. The hinge arms 36 and 37 electrically conduct to the substrate-side bias electrode 11 through arm posts 39 and are supported on the substrate-side bias electrode 11. The mirror 50 electrically conduct to the hinge 35 through the mirror post 51 and is supported by the hinge 35. Therefore, the mirror 50 electrically conducts to the substrate-side bias electrode 11 through the mirror post 51, the hinge 35, the hinge arms 36 and 37, the arm posts 39 and is applied with bias voltage from the substrate-side bias electrode 11. In addition, stoppers 361, 362, 371, and 372 which prevent contact between the mirror 50 and the elevated address electrodes 32 and 33 by coming into contact with the mirror 50 when the mirror 50 is tilted are formed at the tips of the hinge arms 36 and 37.

The elevated address electrodes 32 and 33 configure a drive element 30 which generates an electrostatic force between itself and the mirror 50, thereby driving the mirror 50 so as to tilt. Further, there is a case where the substrate-side address electrodes 12 and 13 are also configured so as to generate an electrostatic force between themselves and the mirror 50, thereby driving the mirror 50 so as to tilt, and in this case, the drive element 30 is configured with the elevated address electrodes 32 and 33 and the substrate-side address electrodes 12 and 13. The hinge 35 is twisted when drive voltage is applied to the elevated address electrodes 32 and 33 and thus the mirror 50 is tilted so as to be attracted to the elevated address electrode 32 or the elevated address electrode 33, as shown in FIGS. 3A and 3B, and exerts a force which returns the mirror 50 to a posture parallel to the element substrate 1, when the application of the drive voltage to the elevated address electrodes 32 and 33 is stopped and thus a suction force to the mirror 50 disappears.

In the electro-optical device 100, for example, as shown in FIG. 3A, if the mirror 50 is tilted to the side of the elevated address electrode 32 on one side, an ON state is created where light emitted from the light source unit 1002 is reflected toward the projection optical system 1004 by the mirror 50. In contrast, as shown in FIG. 3B, if the mirror 50 is tilted to the side of the elevated address electrode 33 on the other side, an OFF state is created where light emitted from the light source unit 1002 is reflected toward a light absorbing device 1005 by the mirror 50, and in such an OFF state, light is not reflected toward the projection optical system 1004. Such driving is performed at each of the plurality of mirrors 50, and as a result, the light emitted from the light source unit 1002 is modulated into image light by the plurality of mirrors 50 and projected from the projection optical system 1004, thereby displaying an image.

In addition, there is also a case where a flat plate-shaped yoke facing the substrate-side address electrodes 12 and 13 is provided integrally with the hinge 35 and the mirror 50 is driven by using even an electrostatic force which acts between the substrate-side address electrodes 12 and 13 and the yoke, in addition to an electrostatic force which is generated between the elevated address electrodes 32 and 33 and the mirror 50.

Overall Structure of Electro-Optical Device 100

Figure 4:
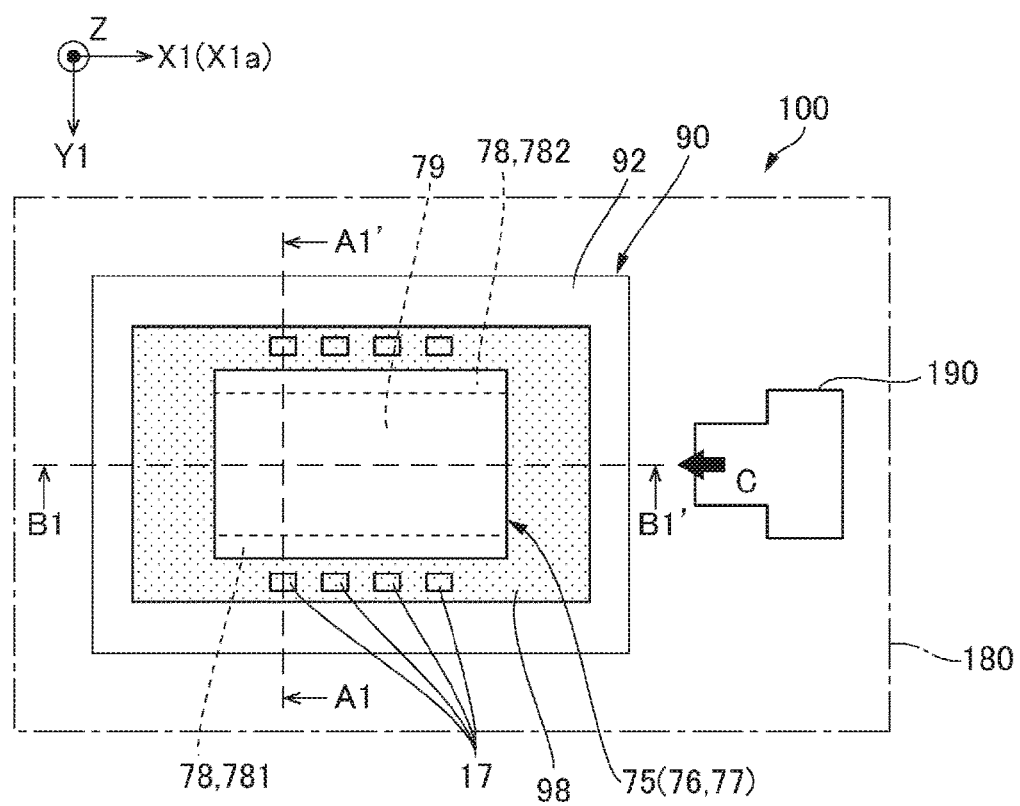
FIG. 4 is a plan view of an electro-optical device according to Embodiment 1 of the invention.
Figure 5A:
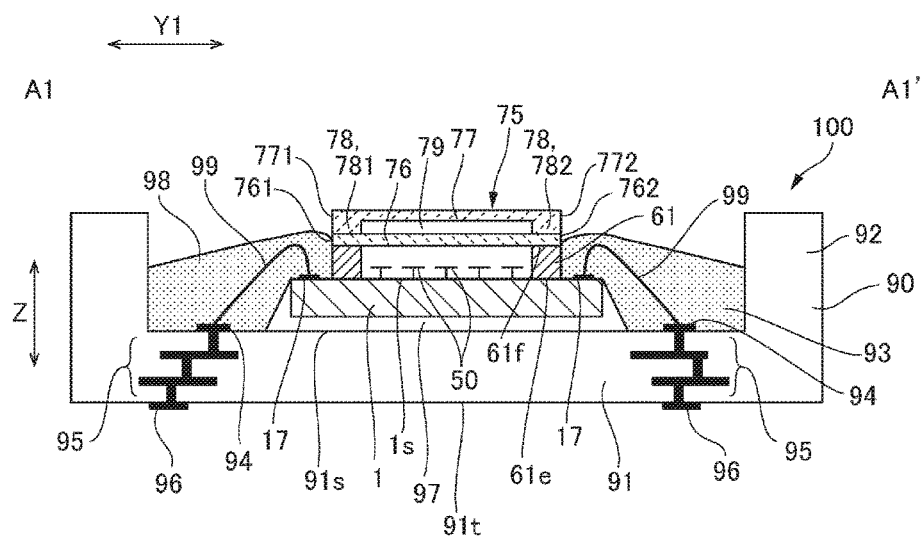
FIGS. 5A and 5B are cross-sectional views of the electro-optical device according to Embodiment 1 of the invention.
Figure 5B:
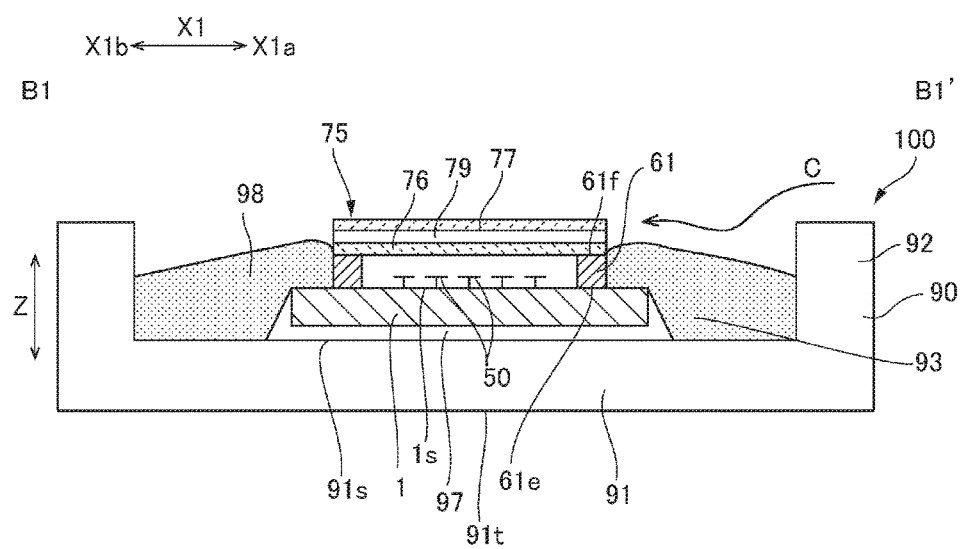

FIG. 4 is a plan view of the electro-optical device 100 according to Embodiment 1 of the invention. FIGS. 5A and 5B are cross-sectional views of the electro-optical device 100 according to Embodiment 1 of the invention, in which FIG. 5A is a cross-sectional view taken along line A1-A1' of FIG. 4 and FIG. 5B is a cross-sectional view taken along line B1-B1' of FIG. 4.

As shown in FIGS. 4, 5A, and 5B, in the electro-optical device 100 of this embodiment, the one-side surface 1s of the element substrate 1 on which the plurality of mirrors 50 and the like described with reference to FIGS. 2A to 3B are formed is sealed by a frame section 61 surrounding the mirrors 50, and a flat plate-shaped cover 75. Further, the frame section 61 is formed so as to surround the mirrors 50 when viewed in a plan view (for example, a plan view when viewed from the one-side surface 1s side of the element substrate 1). Further, the electro-optical device 100 is provided with a support substrate 90 made of a ceramic substrate, and the element substrate 1 is fixed to a concave substrate mounting portion 93 of the support substrate 90 and then sealed by sealing resin 98 such as epoxy resin. In the support substrate 90, the substrate mounting portion 93 is made to be a bottomed concave portion surrounded by a side wall 92, and the element substrate 1 is fixed to a bottom plate portion 91 of the support substrate 90 by an adhesive 97. In this embodiment, as the support substrate 90, an aluminum nitride-based substrate having high thermal conductivity is used. As the adhesive 97, a metal-based adhesive having high thermal conductivity, such as silver paste, is used.

Here, an end portion 61e on the side facing the element substrate 1, of the frame section 61, is bonded to the one-side surface 1s of the element substrate 1. The cover 75 is bonded to an end portion 61f on the side opposite to the end portion 61e of the frame section 61 and supported on the end portion 61f. In this state, the cover 75 faces the surfaces of the mirrors 50 at a position separated by a predetermined distance from the mirrors 50. In other words, the cover 75 is provided on the one-side surface 1s side of the element substrate 1 and disposed such that the mirrors 50 are located between the element substrate 1 and the cover 75. Therefore, light is incident on the mirrors 50 by penetrating the cover 75, and thereafter, the light reflected by the mirrors 50 is emitted by penetrating the cover 75. In this embodiment, the cover 75 is made of glass. The frame section 61 may be made of any of glass, silicon, metal, ceramic, and resin, and in this embodiment, as the frame section 61, a glass substrate or a silicon substrate is used.

A plurality of terminals 17 are formed at end portions (outside the frame section 61) which do not overlap the mirrors 50, in the one-side surface 1s of the element substrate 1. In this embodiment, the terminals 17 are disposed in two rows so as to sandwich the mirrors 50 therebetween. Some of the plurality of terminals 17 are electrically connected to the elevated address electrodes 32 and 33 (the drive element 30) through the addressing circuit 14 or the substrate-side address electrodes 12 and 13 described with reference to FIGS. 2A to 3B. Some other terminals of the plurality of terminals 17 are electrically connected to the mirrors 50 through the addressing circuit 14, the substrate-side bias electrode 11, and the hinge 35 described with reference to FIGS. 2A to 3B. Some still other terminals of the plurality of terminals 17 are electrically connected to a drive circuit or the like provided in front of the addressing circuit 14 described with reference to FIGS. 2A to 3B.

Here, the terminal 17 is in an open state on the side opposite to the element substrate 1, and therefore, the terminal 17 is electrically connected to an internal electrode 94 formed on an inner surface 91s on the element substrate 1 side of the bottom plate portion 91 of the support substrate 90, by a wire 99 for wire bonding. The bottom plate portion 91 of the support substrate 90 is made to be a multilayer wiring substrate, and the internal electrode 94 electrically conduct to an external electrode 96 formed on an outer surface 91t on the side opposite to the element substrate 1, of the bottom plate portion 91, through a through-hole formed in the bottom plate portion 91, or a multilayer wiring section 95 composed of wiring.

The sealing resin 98 is provided inside (a concave portion) of the side wall 92 of the support substrate 90. The sealing resin 98 covers the circumferences of the element substrate 1 and the frame section 61 and also covers the side surface of the cover 75 to the middle in a thickness direction.

Configurations of Cover 75 and the Like

In the electro-optical device 100 of this embodiment, all of the support substrate 90, the element substrate 1, and the cover 75 have a rectangular planar shape. Therefore, in the following description, a description will be made regarding a direction in which a long side in a rectangular planar shape extends, as a first direction X1, and regarding a direction in which a short side extends, as a second direction Y1.

In the electro-optical device 100 of this embodiment, the cover 75 has a first light-transmitting plate 76 which faces the mirrors 50 from the side opposite to the element substrate 1, and a second light-transmitting plate 77 which faces the first light-transmitting plate 76 on the side opposite to the mirrors 50. Further, the second light-transmitting plate 77 is disposed such that the first light-transmitting plate 76 is located between the mirrors 50 and the second light-transmitting plate 77. Further, the first light-transmitting plate 76 has a light-transmitting property, and the second light-transmitting plate 77 has a light-transmitting property. Further, the cover 75 has a spacer 78 between the first light-transmitting plate 76 and the second light-transmitting plate 77. The spacer 78 is provided at a position which does not overlap the mirrors 50 when viewed in a plan view (for example, a plan view when the element substrate 1 is viewed from the one-side surface 1s side), and a gap 79 is configured between the first light-transmitting plate 76 and the second light-transmitting plate 77 due to the spacer 78. Further, the sealing resin 98 is provided such that the surface of the sealing resin 98 is at a height position which does not block the gap 79.

In this embodiment, the spacer 78 is composed of a convex portion formed integrally with the second light-transmitting plate 77. Therefore, the first light-transmitting plate 76 is bonded to an end portion on the first light-transmitting plate 76 side of the spacer 78, thereby being laminated with the second light-transmitting plate 77.

The gap 79 is open toward both sides in the first direction X1 intersecting a thickness direction Z in which the first light-transmitting plate 76 and the second light-transmitting plate 77 face each other. More specifically, the spacer 78 includes a first spacer 781 extending in the first direction X1, and a second spacer 782 extending in the first direction X1 at a position separated from the first spacer 781 in the second direction Y1 with respect to the first spacer 781. For this reason, the gap 79 is open toward both sides in the first direction X1 between the first spacer 781 and the second spacer 782. Further, the first spacer 781 and the second spacer 782 are provided so as to avoid at least a portion of an end portion (a first end portion) on one side in the first direction X1 of the first light-transmitting plate 76 and avoid at least a portion of an end portion (a second end portion) on the other side in the first direction X1 of the first light-transmitting plate 76.

The first spacer 781 and the second spacer 782 respectively extend in the first direction X1 along end portions 761 and 762 which are located on both sides in the second direction Y1 (both sides in a short side direction) in the first light-transmitting plate 76. In this embodiment, the first light-transmitting plate 76 and the second light-transmitting plate 77 are portions cut at the same time from a wafer in a manufacturing process which will be described later. For this reason, the first light-transmitting plate 76 and the second light-transmitting plate 77 overlap each other to have the same size and the same shape. Therefore, the first spacer 781 and the second spacer 782 extend in the first direction X1 along end portions 771 and 772 which are located on both sides in the second direction Y1 (both side in the short side direction) in the second light-transmitting plate 77.

As shown in FIG. 4, in the electro-optical device 100 of this embodiment, a blower 190 composed of a blast fan or the like which supplies air toward the gap 79 from one side X1a in the first direction X1 is provided outside the support substrate 90, and the support substrate 90 and the blower 190 are held by a holder 180. For this reason, an air flow supplied toward the gap 79 from the blower 190 gets over the side wall 92 of the support substrate 90 and flows from the one side X1a in the first direction X1 into the gap 79, as shown by an arrow C in FIG. 5B, and flows out from the other side X1b in the first direction X1 through the gap 79.

Main Effect of this Embodiment

As described above, in the electro-optical device 100 of this embodiment, light is incident on the mirrors 50 by penetrating the cover 75, and the light reflected by the mirrors 50 is emitted by penetrating the cover 75. At this time, the temperature of the element substrate 1 or the cover 75 tries to rise due to the light illuminated to the cover 75 or the one-side surface 1s of the element substrate 1. Here, in the cover 75, the gap 79 which is open toward both sides in the first direction X1 is provided between the first light-transmitting plate 76 and the second light-transmitting plate 77 due to the spacer 78. For this reason, by passing a fluid such as air through the gap 79, it is possible to increase heat dissipation in the cover 75. For example, when an air flow supplied toward the gap 79 from the blower 190 gets over the side wall 92 of the support substrate 90 and flows from the one side X1a in the first direction X1 into the gap 79, as shown by an arrow C in FIG. 5B, and then passes through the gap 79, the air flow takes heat from the cover 75. Therefore, even when the temperature of the element substrate 1 or the like tries to rise due to the illuminated light or the like, it is possible to suppress a rise in the temperature of the element substrate 1 or the like. For this reason, it is possible to suppress a malfunction or a decrease in life of the electro-optical device 100.

Further, the spacer 78 is configured integrally with the second light-transmitting plate 77, and therefore, it is possible to improve the efficiency of assembly work of the electro-optical device 100.

Further, the spacer 78 is composed of the first spacer 781 and the second spacer 782 which extend in the first direction X1 at positions separated from each other in the second direction Y1. For this reason, when an air flow passes through the gap 79, the air flow does not leak in the second direction Y1 from the gap 79. Therefore, the flow velocity of the air flow in the gap 79 is fast, and therefore, it is possible to increase heat dissipation in the cover 75.

Further, the first spacer 781 and the second spacer 782 extend in the first direction X1 along the end portions 761 and 762 which are located on both sides in the second direction Y1 in the first light-transmitting plate 76. For this reason, the plane area of the gap 79 is wide, and therefore, when an air flow passes through the gap 79, it is possible to widen the contact area between the cover 75 and the air flow. For this reason, it is possible to increase heat dissipation in the cover 75.

Further, the electro-optical device 100 is provided with the blower 190 which supplies air toward the gap 79 from the one side X1a in the first direction X1 with respect to the gap 79. For this reason, it is possible to reliably pass an air flow through the gap 79 between the first light-transmitting plate 76 and the second light-transmitting plate 77, and therefore, it is possible to increase heat dissipation in the cover 75.

Further, the gap 79 is open toward a longitudinal direction of the cover 75. For this reason, flow velocity when an air flow passes through the gap 79 is fast, and therefore, it is possible to increase heat dissipation in the cover 75.

Method of Manufacturing Electro-Optical Device 100

A method of manufacturing the electro-optical device 100 according to Embodiment 1 of the invention will be described with reference to FIGS. 6A to 9C. FIGS. 6A to 6D are process cross-sectional views showing a method of manufacturing the electro-optical device 100 according to Embodiment 1 of the invention. FIGS. 7A and 7B are process diagrams showing a method of manufacturing a first wafer or the like which is used in the manufacturing of the electro-optical device 100 according to Embodiment 1 of the invention. FIGS. 8A to 8F are process diagrams showing a method of manufacturing a laminated wafer or the like which is used in the manufacturing of the electro-optical device 100 according to Embodiment 1 of the invention. FIGS. 9A to 9C are process cross-sectional views showing a process of sealing the element substrate 1 by the support substrate 90 and the sealing resin 98 in the manufacturing process of the electro-optical device 100 according to Embodiment 1 of the invention. In addition, in FIGS. 7A, 7B and 8A to 8F, a plan view of a wafer in each process is shown and a cut end view is shown below the plan view. Further, in FIG. 7B, illustration of the mirror and the like is omitted, and in FIGS. 8A to 8F and the like, illustration of the drive element 30 and the like is omitted, and the number of mirrors 50 is reduced and thus three mirrors 50 are shown as being formed on a single element substrate 1.

Figure 6A:
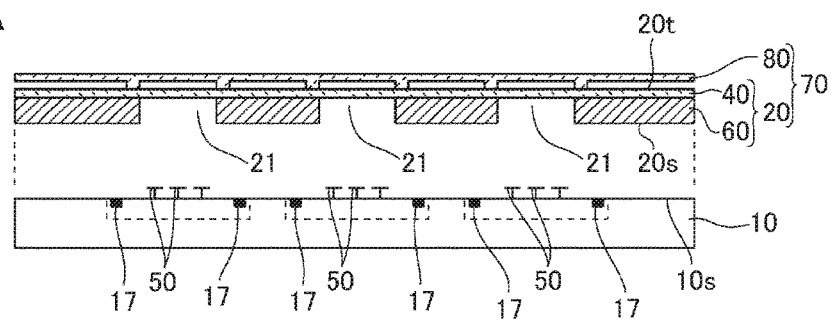
FIGS. 6A to 6D are process cross-sectional views showing a method of manufacturing the electro-optical device according to Embodiment 1 of the invention.
Figure 7A:
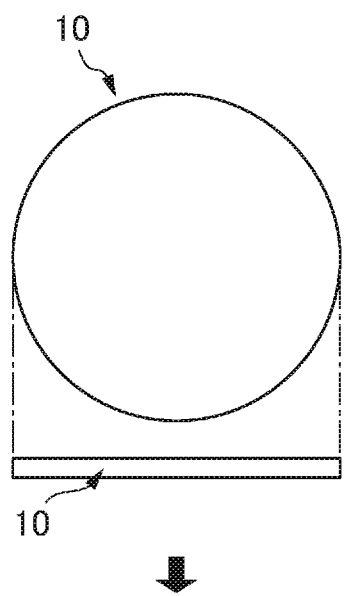
FIGS. 7A and 7B are process diagrams showing a method of manufacturing a first wafer or the like which is used in the manufacturing of the electro-optical device according to Embodiment 1 of the invention.
Figure 7B:
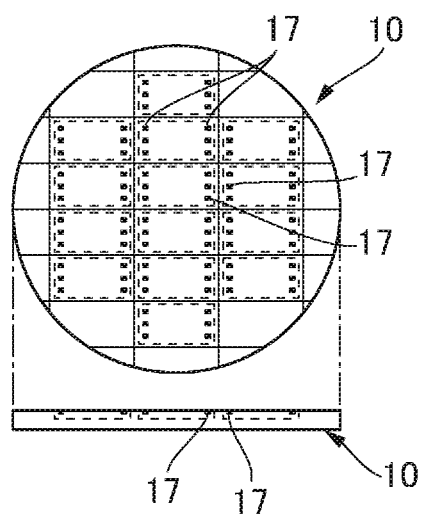

In order to manufacture the electro-optical device 100 of this embodiment, as shown in FIGS. 6A and 7B, in a first wafer preparation process, a first wafer 10 is prepared in which the mirrors 50 or the terminals 17 are formed for each area where the element substrate 1 is divided, with respect to a one-side surface 10s (a first surface) of the large-size first wafer 10 from which a large number of element substrates 1 can be taken, and the drive element 30 (refer to FIGS. 2A to 3B) driving each of the mirrors 50 is formed at a position which overlaps the mirror 50 when viewed in a plan view. For example, as shown in FIGS. 6A, 7A, and 7B, the first wafer 10 may be prepared by forming the mirrors 50 for each area where the element substrate 1 is divided, with respect to the one-side surface 10s of the large-size first wafer 10 from which a large number of element substrates 1 can be taken, and forming the drive element 30 (refer to FIGS. 2A to 3B) driving each of the mirrors 50, at a position which overlaps the mirror 50 when viewed in a plan view.

Further, as shown in FIG. 6A, in a laminated wafer formation process, a laminated wafer 70 is formed in which a second wafer 20 having a light-transmitting property and a third wafer 80 having a light-transmitting property are laminated with the spacer 78 interposed therebetween and a concave portion 21 is formed in a second surface 20s on the side opposite to the surface facing the third wafer 80, of the second wafer 20.

Figure 8A:
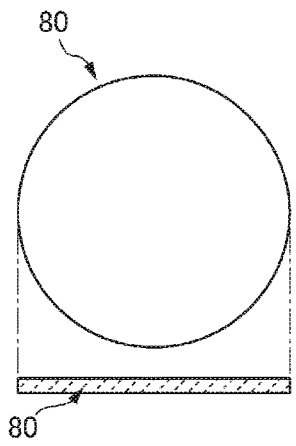
FIGS. 8A to 8F are process diagrams showing a method of manufacturing a laminated wafer or the like which is used in the manufacturing of the electro-optical device according to Embodiment 1 of the invention.
Figure 8E:
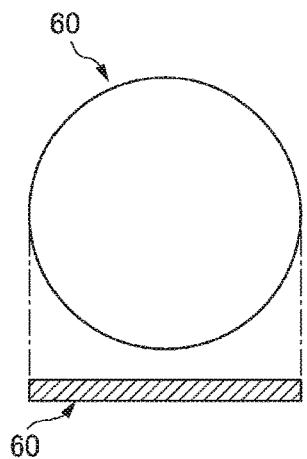
Figure 8D:
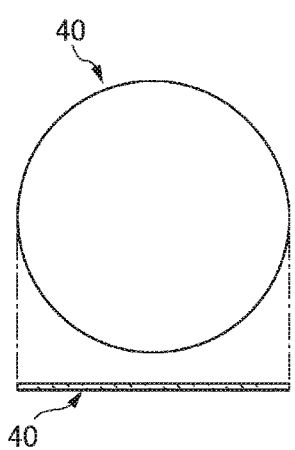
Figure 8B:
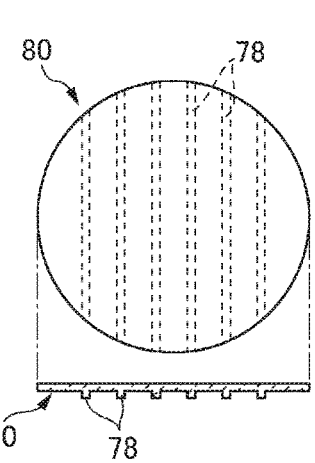
Figure 8F:
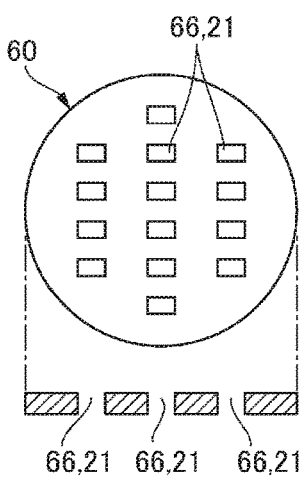
Figure 8C:
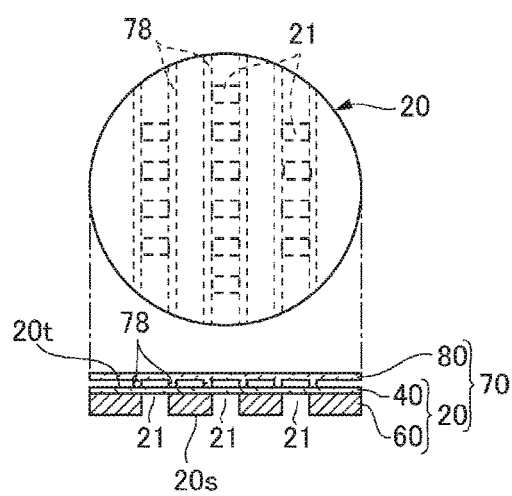
Figure 9A:
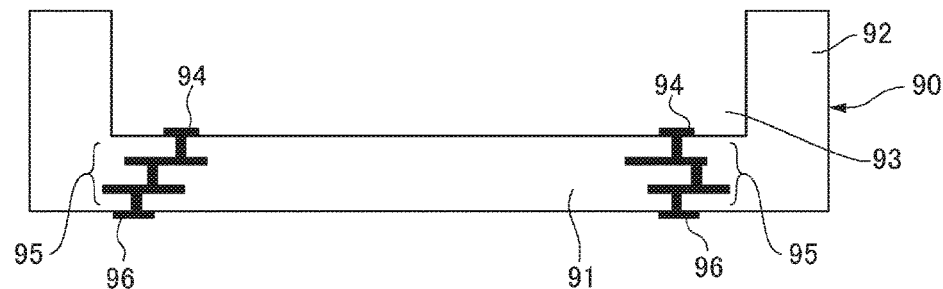
FIGS. 9A to 9C are process cross-sectional views showing a process of sealing an element substrate by a support substrate and sealing resin in the manufacturing process of the electro-optical device according to Embodiment 1 of the invention.
Figure 9B:
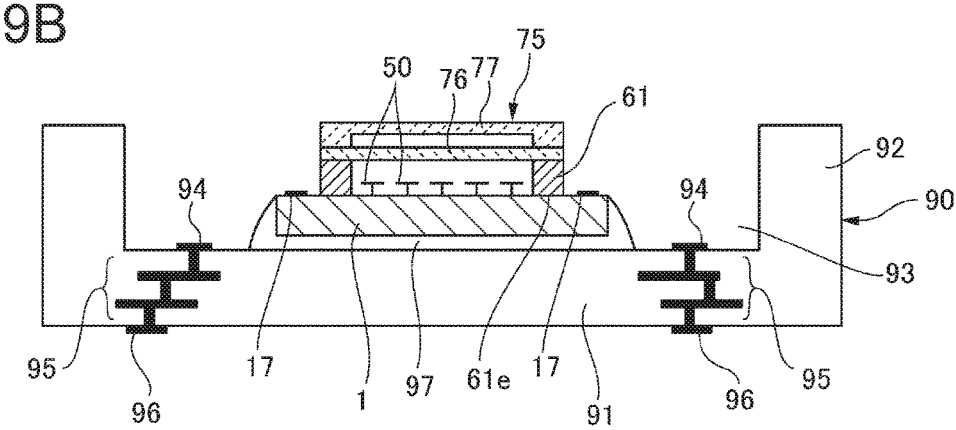
Figure 9C:
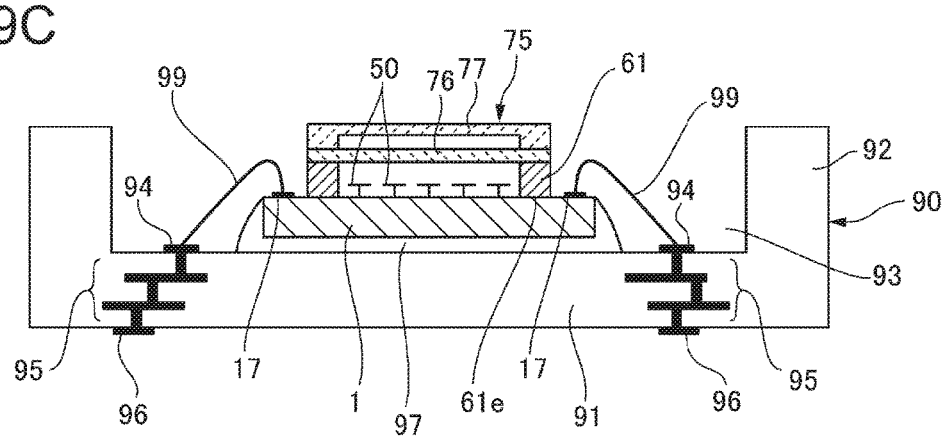

Here, in the laminated wafer formation process, for example, as shown in FIGS. 8A and 8B, the spacers 78 are formed integrally with the large-size third wafer 80 from which a large number of second light-transmitting plates 77 can be taken. Further, as shown in FIG. 8C, a fourth wafer 40 (refer to FIG. 8D) having a light-transmitting property, which configures the third surface 20t side on the side opposite to the second surface 20s of the second wafer 20, is bonded to overlap the side on which the spacers 78 are formed, of the third wafer 80, and a fifth wafer 60 (refer to FIGS. 8C and 8F) having a light-transmitting property, which configures the second surface 20s side of the second wafer 20, is bonded to overlap the fourth wafer 40, and thus the laminated wafer 70 is configured. Here, a through-hole 66 for configuring the concave portion 21 is formed in the fifth wafer 60 by etching or the like (refer to FIG. 8F). An opening on one side of the through-hole 66 is blocked by the fourth wafer 40, whereby the through-hole 66 becomes the concave portion 21. In this embodiment, after the fourth wafer 40 is bonded to overlap the third wafer 80, the fifth wafer 60 is bonded to overlap the fourth wafer 40. However, a configuration may be made in which after the fifth wafer 60 is bonded to overlap the fourth wafer 40, the third wafer 80 is bonded to overlap the fifth wafer 60.

Figure 6B:
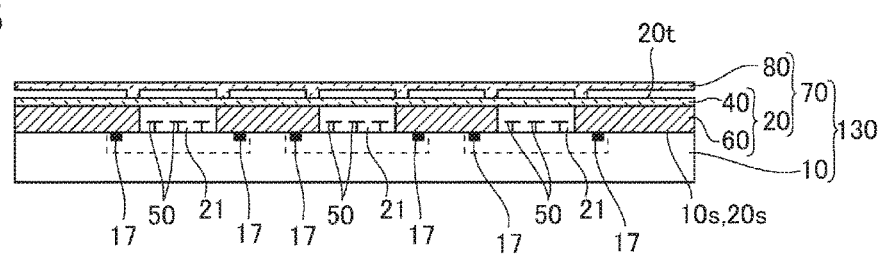

Next, in a bonding process shown in FIG. 6B, the one-side surface 10s of the first wafer 10 and the second surface 20s of the second wafer 20 are bonded to overlap each other such that the concave portion 21 overlaps the mirrors 50 when viewed in a plan view.

Figure 6C:
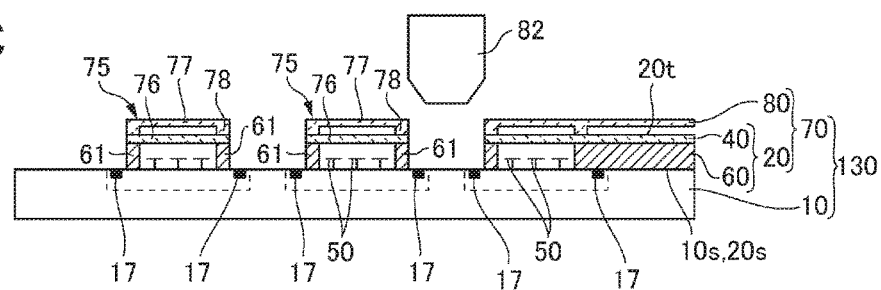
Figure 6D:
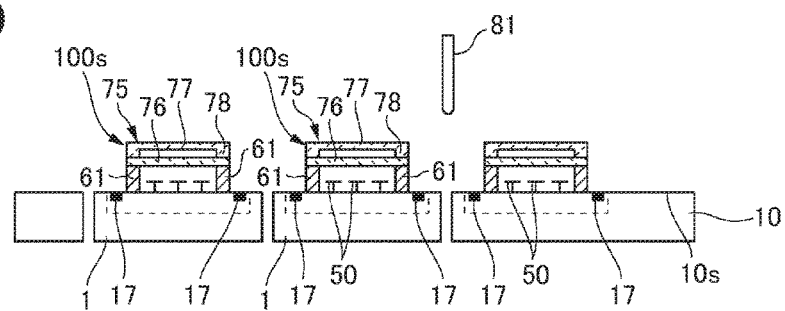

Next, in a dividing process shown in FIGS. 6C and 6D, a laminated body 130 of the first wafer 10 and the laminated wafer 70 is divided into portions, in each of which the cover 75 is fixed to overlap the element substrate 1 provided with the mirrors 50, thereby obtaining laminated bodies 100s having a single item size.

In such a dividing process, first, in a second wafer dicing process shown in FIG. 6C, the laminated wafer 70 is diced by making a second wafer dicing blade 82 penetrate from the third wafer 80 side into the laminated wafer 70. As a result, the laminated wafer 70 is divided and thus the cover 75 is configured. At this time, the frame section 61 is configured by a frame portion divided from the fifth wafer 60, the first light-transmitting plate 76 is configured by a flat plate portion divided from the fourth wafer 40, and the second light-transmitting plate 77 is configured by a flat plate portion divided from the third wafer 80.

Next, in a first wafer dicing process shown in FIG. 6D, the first wafer 10 is diced by making a first wafer dicing blade 81 penetrate from the laminated wafer 70 side into a cutting place of the laminated wafer 70 with respect to the first wafer 10. As a result, a plurality of the laminated bodies 100s, in each of which the one-side surface 1s of the element substrate 1 with the plurality of mirrors 50 formed thereon is sealed by the frame section 61 and the cover 75, are manufactured. Further, in this embodiment, a wafer of a circular shape is used. However, the planar shape thereof may be a rectangular shape or the like.

In order to perform sealing using the support substrate 90 and the sealing resin 98 shown in FIGS. 5A and 5B on the laminated body 100s obtained by the above process, processes shown in FIGS. 9A to 9C are performed.

First, after the support substrate 90 in which the substrate mounting portion 93 is a concave portion surrounded by the side wall 92 is prepared, as shown in FIG. 9A, the element substrate 1 is fixed to a bottom portion of the substrate mounting portion 93 by the adhesive 97, as shown in FIG. 9B. Next, as shown in FIG. 9C, the terminal 17 of the element substrate 1 and the internal electrode 94 of the support substrate 90 are electrically connected to each other by the wire 99 for wire bonding. Next, as shown in FIGS. 5A and 5B, after the sealing resin 98 is injected inside the side wall 92 of the support substrate 90, the sealing resin 98 is cured, whereby the element substrate 1 is sealed by the sealing resin 98. As a result, it is possible to obtain the electro-optical device 100 in which the element substrate 1 is sealed by the frame section 61, the cover 75, the support substrate 90, and the sealing resin 98.

Embodiment 2

Figure 10:
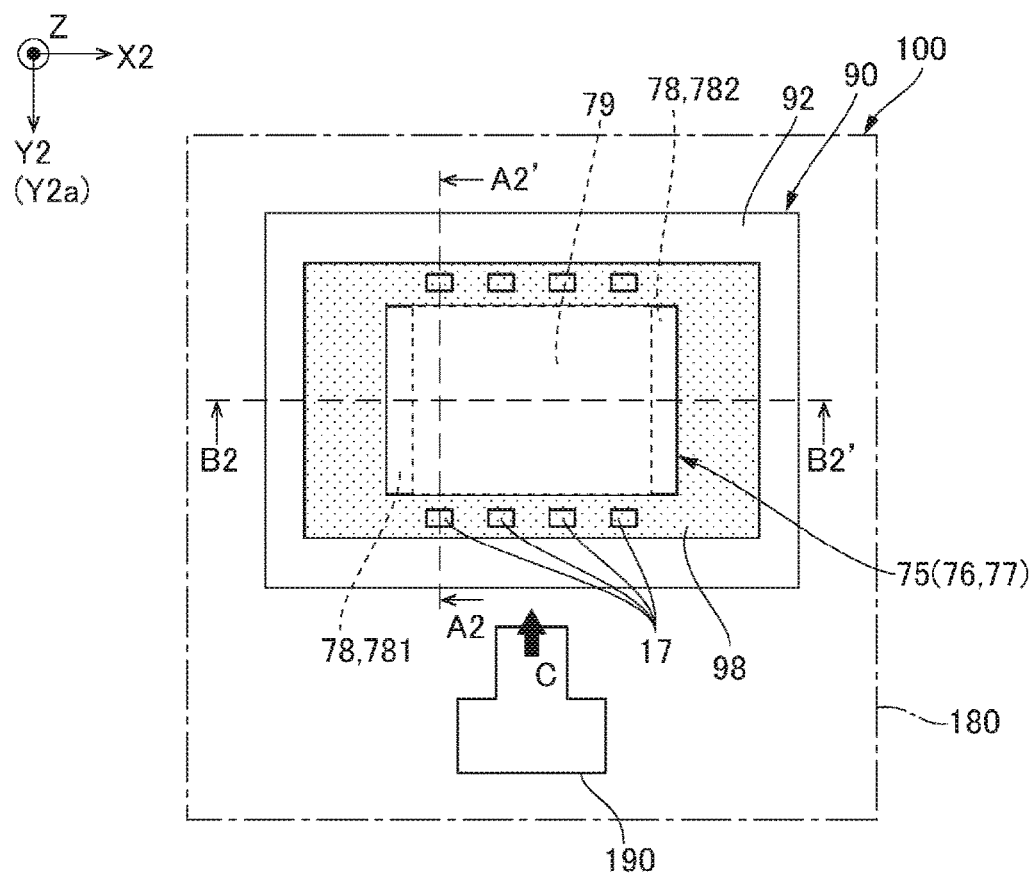
FIG. 10 is a plan view of an electro-optical device according to Embodiment 2 of the invention.
Figure 11A:
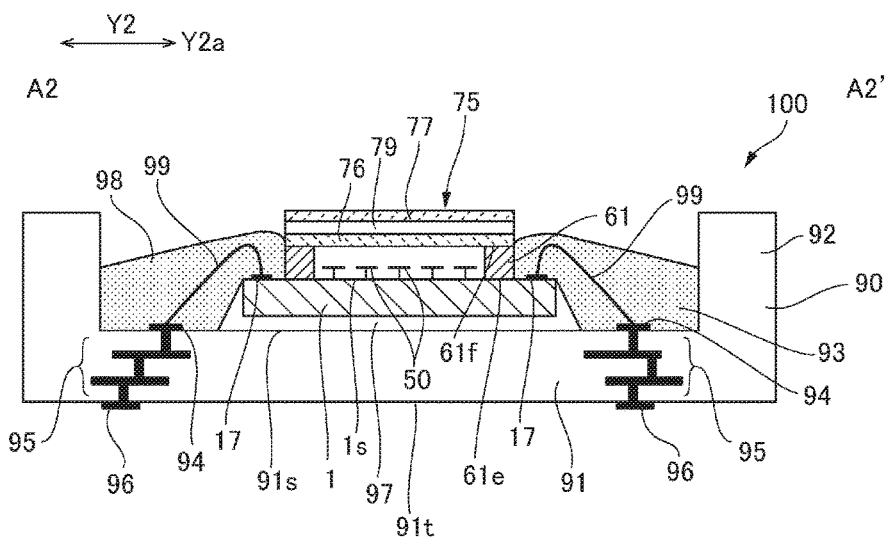
FIGS. 11A and 11B are cross-sectional views of the electro-optical device according to Embodiment 2 of the invention.
Figure 11B:
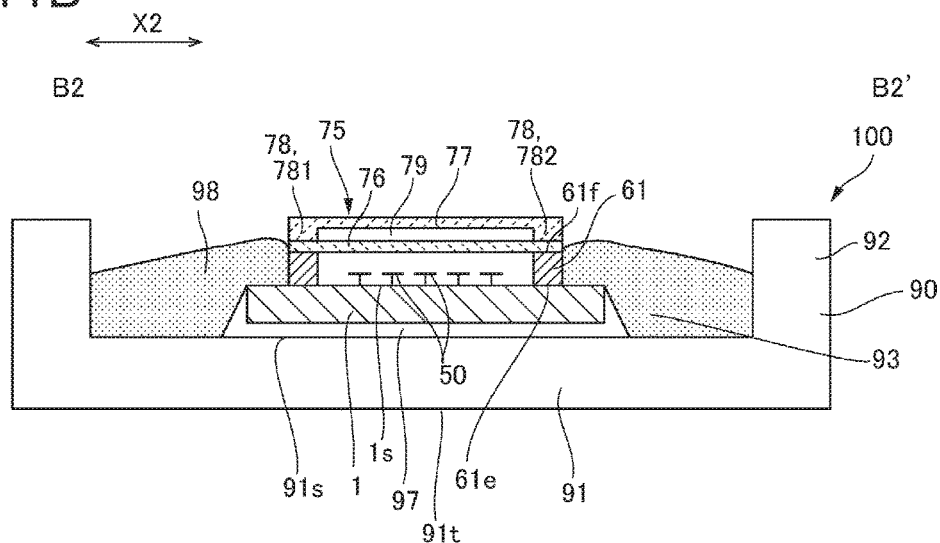

FIG. 10 is a plan view of an electro-optical device 100 according to Embodiment 2 of the invention. FIGS. 11A and 11B are cross-sectional views of the electro-optical device 100 according to Embodiment 2 of the invention, in which FIG. 11A is a cross-sectional view taken along line A2-A2' of FIG. 10 and FIG. 11B is a cross-sectional view taken along line B2-B2' of FIG. 10. In addition, a basic configuration of this embodiment is the same as that of Embodiment 1 described with reference to FIGS. 4, 5A, 5B, and the like, and therefore, common portions are denoted by the same reference numerals and description thereof is omitted.

In the electro-optical device 100 shown in FIGS. 10, 11A, and 11B, all of the support substrate 90, the element substrate 1, and the cover 75 have a rectangular planar shape. Therefore, in the following description, a description will be made regarding a direction in which a short side in a rectangular planar shape extends, as a first direction Y2, and regarding a direction in which along side extends, as a second direction X2.

Also in the electro-optical device 100 of this embodiment, similar to Embodiment 1, the cover 75 has the first light-transmitting plate 76 which faces the mirrors 50 from the side opposite to the element substrate 1, and the second light-transmitting plate 77 which faces the first light-transmitting plate 76 on the side opposite to the mirrors 50. Further, the cover 75 has the spacer 78 between the first light-transmitting plate 76 and the second light-transmitting plate 77. Here, the spacer 78 is provided at a position which does not overlap the mirrors 50 when viewed in a plan view, and the gap 79 is configured between the first light-transmitting plate 76 and the second light-transmitting plate 77 due to the spacer 78. The spacer 78 is composed of a convex portion formed integrally with the second light-transmitting plate 77.

Here, in Embodiment 1, the gap 79 is open toward an extending direction of the long side of the cover 75. However, in this embodiment, the gap 79 is open toward an extending direction of the short side of the cover 75. More specifically, the spacer 78 includes a first spacer 781 extending in the first direction Y2, and a second spacer 782 extending in the first direction Y2 at a position separated from the first spacer 781 in the second direction X2 with respect to the first spacer 781. For this reason, the gap 79 is open toward both sides in the first direction Y2 between the first spacer 781 and the second spacer 782. Further, the electro-optical device 100 is provided with the blower 190 which supplies air toward the gap 79 from one side Y2a in the first direction Y2 with respect to the gap 79. Also in a case of being configured in this manner, the same effect as that in Embodiment 1, such as heat dissipation in the cover 75 being able to be increased by passing a fluid such as air through the gap 79, is exhibited.

Embodiment 3

Figure 12:
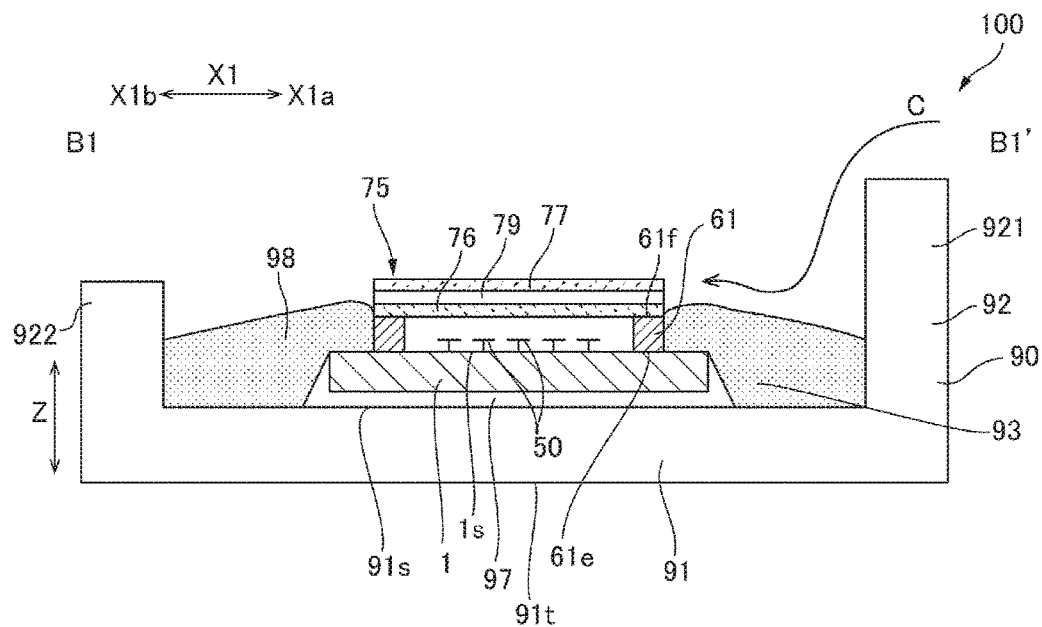
FIG. 12 is a cross-sectional view of an electro-optical device according to Embodiment 3 of the invention.
Figure 13:
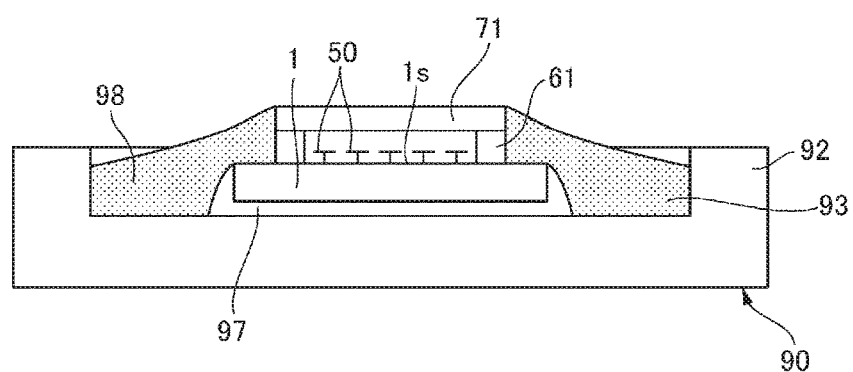
FIG. 13 is a cross-sectional view of an electro-optical device according to a reference example of the invention.

FIG. 12 is a cross-sectional view of an electro-optical device 100 according to Embodiment 3 of the invention. In addition, a basic configuration of this embodiment is the same as the configuration described with reference to FIGS. 4, 5A, 5B, and the like, and therefore, common portions are denoted by the same reference numerals and description thereof is omitted.

In the embodiment described with reference to FIGS. 4, 5A, 5B, and the like, the height of the side wall 92 formed at the support substrate 90 is the same height in any location. In contrast, in this embodiment, as shown in FIG. 12, the height from the bottom plate portion 91, of a first side wall 921 which is located on the one side X1a in the first direction X1, from which an air flow (an arrow C) is supplied, of the side wall 92, is higher the height from the bottom plate portion 91, of a second side wall 922 which is located on the side (the other side X1b in the first direction X1) opposite to the side from which the air flow (the arrow C) is supplied.

For this reason, as shown by the arrow C in FIG. 12, the air flow having gotten over the first side wall 921 greatly wraps around to the inside of the first side wall 921 and then easily flows toward the gap 79. Therefore, it is possible to increase heat dissipation in the cover 75. Such a configuration may be applied to the embodiment described with reference to FIGS. 10, 11A, and 11B.

Other Embodiments

In the embodiments described above, the spacers 78 are disposed along two sides facing each other. However, an aspect in which the spacers 78 are disposed at four corner of a quadrangle may be adopted.

In the embodiments described above, the blower 190 is provided in the electro-optical device 100. However, in FIG. 4 or 10, an electro-optical unit is configured with an electro-optical device in which the element substrate 1 and the like are supported on the support substrate 90, and the blower 190, and in such an electro-optical unit, a structure in which the electro-optical device in which the element substrate 1 and the like are supported on the support substrate 90, and the blower 190 are held by the holder 180 is also acceptable. The electro-optical unit having such a configuration is used to be fixed to a casing or the like of the projection type display device 1000 shown in FIG. 1.

Further, in the embodiments described above, the spacer 78 is formed integrally with the second light-transmitting plate 77. However, a configuration in which the spacer 78 is formed integrally with the first light-transmitting plate 76 may be adopted. Further, the spacer 78 may be a separate body from the second light-transmitting plate 77 and the first light-transmitting plate 76, and such a configuration can be realized by making another wafer to form the spacer 78 be bonded to overlap the third wafer 80.

What is claimed is:
1. An electro-optical device comprising:
an element substrate on which a mirror and a drive element which drives the mirror are provided on a first surface side; and
a cover which is provided on the first surface side and disposed such that the mirror is located between the element substrate and the cover,
wherein the cover includes
a first light-transmitting plate having a light-transmitting property,
a second light-transmitting plate having a light-transmitting property and disposed such that the first light-transmitting plate is located between the mirror and the second light-transmitting plate, and
a spacer which is interposed between the first light-transmitting plate and the second light-transmitting plate and provided with a gap which is open toward both sides in a first direction intersecting a thickness direction in which the first light-transmitting plate and the second light-transmitting plate face each other, between the first light-transmitting plate and the second light-transmitting plate, wherein the spacer comprises a first spacer extending in a first direction, and a second spacer extending in the first direction, and wherein the first spacer and the second spacer are each disposed to avoid at least a portion of a first end portion of the first light-transmitting plate in the first direction and avoid at least a portion of a second end portion facing the first end portion of the first light-transmitting plate in the first direction.

2. The electro-optical device according to claim 1, wherein the spacer is configured integrally with the second light-transmitting plate.

3. The electro-optical device according to claim 1, wherein the second spacer extends in the first direction at a position separated from the first spacer in a second direction intersecting the thickness direction and the first direction with respect to the first spacer, and
the gap is open toward both sides in the first direction between the first spacer and the second spacer.

4. The electro-optical device according to claim 3, wherein the first spacer and the second spacer extend in the first direction along second end portions which are located on both sides in the second direction in the first light-transmitting plate.

5. The electro-optical device according to claim 1, further comprising:
a blower which supplies air toward the gap from one side in the first direction with respect to the gap.

6. The electro-optical device according to claim 5, further comprising:
a support substrate on which the element substrate is mounted,
wherein the support substrate is provided with a bottom plate portion on which the element substrate is mounted, a first side wall which protrudes from the bottom plate portion to a side on which the element substrate is mounted, on the one side in the first direction with respect to the element substrate, and a second side wall which protrudes from the bottom plate portion to the side on which the element substrate is mounted, on the other side in the first direction with respect to the element substrate, and
the first side wall has a higher height from the bottom plate portion than the second side wall.

7. An electro-optical unit comprising:
an electro-optical device;
a blower which supplies air to the electro-optical device; and
a holder which supports the electro-optical device and the blower,
wherein the electro-optical device has
an element substrate on which a mirror and a drive element which drives the mirror are provided on a first surface side, and
a cover which is disposed such that the mirror is located between the element substrate and the cover, and
the cover includes
a first light-transmitting plate having a light-transmitting property,
a second light-transmitting plate having a light-transmitting property and disposed such that the first light-transmitting plate is located between the mirror and the second light-transmitting plate, and
a spacer which is interposed between the first light-transmitting plate and the second light-transmitting plate at a position which does not overlap the mirror when viewed in a plan view, and is provided with a gap which is open toward both sides in a first direction intersecting a thickness direction in which the first light-transmitting plate and the second light-transmitting plate face each other, between the first light-transmitting plate and the second light-transmitting plate, wherein the spacer comprises a first spacer extending in a first direction, and a second spacer extending in the first direction, and wherein the first spacer and the second spacer are each disposed to avoid at least a portion of a first end portion of the first light-transmitting plate in the first direction and avoid at least a portion of a second end portion facing the first end portion of the first light-transmitting plate in the first direction.

8. An electronic apparatus comprising:
the electro-optical device according to claim 1; and
a light source unit which irradiates the mirror with light source light.

* * * * *